US006806129B1

United States Patent
McHugo et al.

(10) Patent No.: US 6,806,129 B1
(45) Date of Patent: Oct. 19, 2004

(54) SELF-ALIGNED PROCESS USING INDIUM GALLIUM ARSENIDE ETCHING TO FORM REENTRY FEATURE IN HETEROJUNCTION BIPOLAR TRANSISTORS

(75) Inventors: Scott A. McHugo, Menlo Park, CA (US); Gregory N. DeBrabander, San Jose, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/435,230

(22) Filed: May 9, 2003

(51) Int. Cl.[7] .................................. H01L 21/8238
(52) U.S. Cl. ............... 438/205; 438/313; 438/320; 438/340; 257/197; 257/273; 257/370; 257/565
(58) Field of Search .................. 257/47, 197, 205, 257/273, 350, 361, 370, 378, 423, 462, 477–479, 511, 512, 517, 518, 525, 526, 539–543, 552–593

(56) References Cited

U.S. PATENT DOCUMENTS 5,665,614 A * 9/1997 Hafizi et al. ............... 438/320
5,729,033 A * 3/1998 Hafizi ....................... 257/198
5,804,487 A * 9/1998 Lammert ................... 438/319
6,310,368 B1 * 10/2001 Yagura ....................... 257/197
6,376,867 B1 * 4/2002 Gutierrez-Aitken et al. 257/197
6,406,965 B1     6/2002 Lammert
6,605,519 B2 * 8/2003 Lishan ....................... 438/555

OTHER PUBLICATIONS

Michael S. Chang, "Indium Phosphide npn Heterojunciton Bipolar Transistor (HBT): Project I+Project II", EECS 521 Project I+Project II, Apr., 2002, pp 1–15.
Bart J. Van Zeghbroeck, "The Bipolar Junction Transistor", Principlesof Electronic Devices, pp 7.1–7.7.

* cited by examiner

Primary Examiner—David Nelms
Assistant Examiner—Andy Huynh (57) ABSTRACT

A method for forming a heterojunction bipolar transistor (HBT) includes forming an etch mask a top layer of the HBT to expose a portion of the emitter cap layer, and selectively etching the exposed portion of the emitter cap layer to (1) form a reentry feature and (2) to expose a portion of the emitter layer. The method further includes selectively etching the exposed portion of the emitter layer to expose a portion of the base layer, and forming a metal layer over the exposed portion of the base layer and the exposed portion of the emitter cap layer.

12 Claims, 9 Drawing Sheets

Fig. 8D

SELF-ALIGNED PROCESS USING INDIUM GALLIUM ARSENIDE ETCHING TO FORM REENTRY FEATURE IN HETEROJUNCTION BIPOLAR TRANSISTORS

FIELD OF INVENTION

This invention relates to a heterojunction bipolar transistor (HBT), and more specifically to a self-aligned process for fabricating emitter and base metals for a HBT that reduces base resistance.

DESCRIPTION OF RELATED ART

Figure 1:
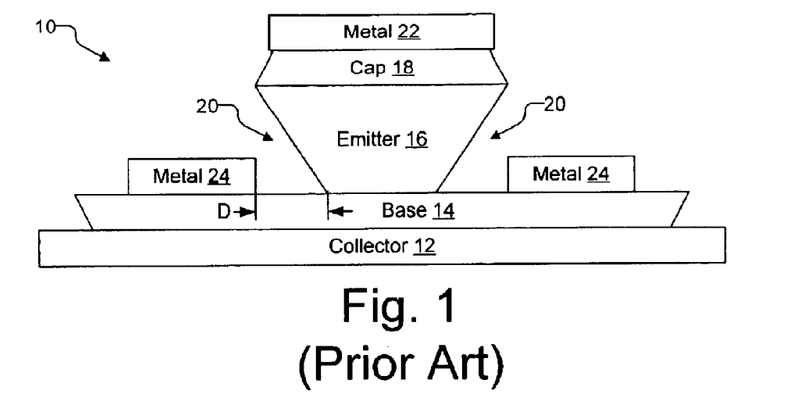
FIGS. 1, 2A, 2B, 2C, 3A, 3B, and 4 illustrate conventional heterojunction bipolar transistors.

A heterojunction bipolar transistor (HBT) is a bipolar transistor having two adjacent layers of different materials. FIG. 1 illustrates a conventional HBT 10. HBT 10 includes a collector 12, a base 14, an emitter 16, and an emitter cap 18.

Emitter metal 22 and base metals 24 are typically made in a self-aligned process. In such a process, reentry features 20 are formed in emitter 16. Reentry features 20 are ledges, overhangs, and other features with an undercut profile. Reentry features 20 are formed by selectively wet etching emitter 16. Metal is then deposited on cap 18 and base 14 to form emitter metal 22 and base metals 24, respectively. Reentry features 20 create breaks in emitter metal 22 and base metals 24 so they are not electrically shorted.

One of the goals in designing an HBT is to minimize the base resistance, which is the resistance between emitter 16 and base metal 24 through base 14. One way to minimize the base resistance is to reduce a distance D between emitter 16 and base metal 24. Distance D can be reduced by controlling the shape of reentry features 20.

Figure 2A:
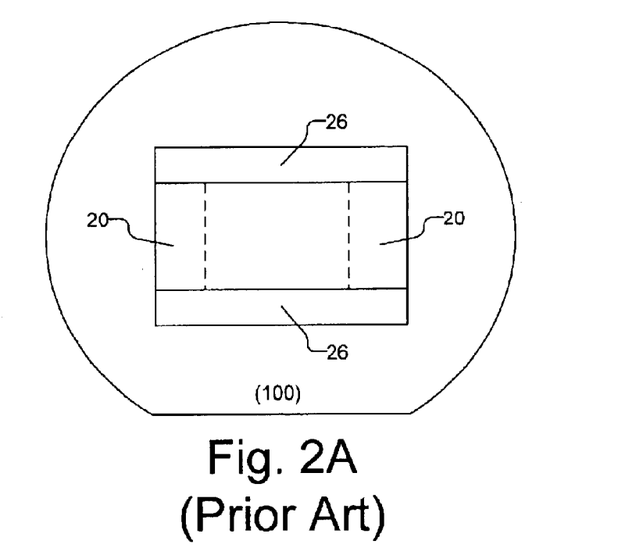
Figure 2B:
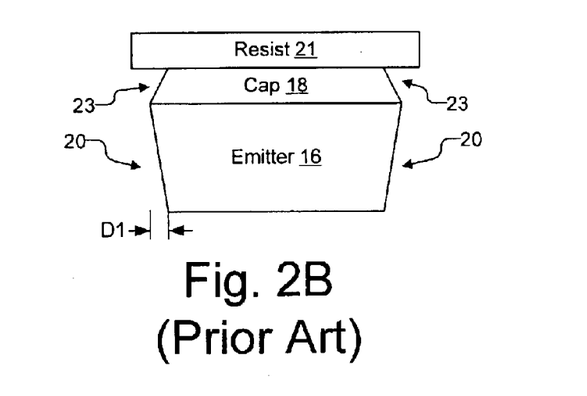

As described above, reentry features 20 can be formed by selectively wet etching emitter 16 underneath a photoresist. FIGS. 2A and 2B illustrate a wet etch of an InP (indium phosphide) emitter 16 underneath a photoresist 21 in a direction perpendicular to the (100) wafer flat. This wet etch forms ledges in the InP emitter 16 that can be used as reentry features 20. FIG. 2B also shows a wet etch of an InGaAs (indium gallium arsenide) cap 18 underneath photoresist 21. This wet etch forms ramps 23 in the InGaAs cap 18 that cannot be used as reentry features.

Figure 2C:
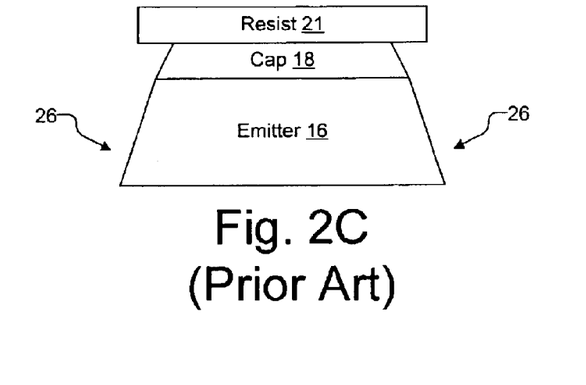

FIGS. 2A and 2C illustrate a wet etch of the InP emitter 16 underneath photoresist 21 in a direction parallel to the (100) wafer flat. This wet etch forms ramps 26 in the InP emitter 16 that cannot be used as reentry features. However, ramps 26 can be used as means to run metal lines up to the top layer.

Unfortunately, experiments show that wet etching perpendicular to the (100) wafer flat produces ledges with insufficient overhangs. This is illustrated in FIG. 2B, where distance D1 from a base metal (not shown) to emitter 16 (created by a first reentry feature) is not sufficient to produce the overhang necessary to separate the metal deposited on base 14 and emitter cap 18.

Figure 3A:
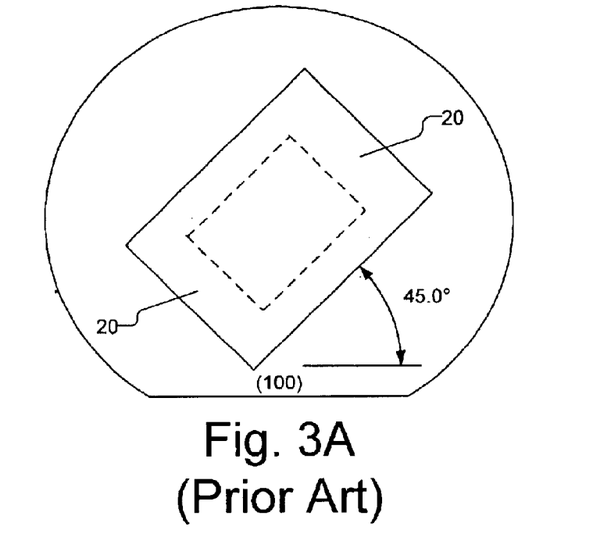
Figure 3B:
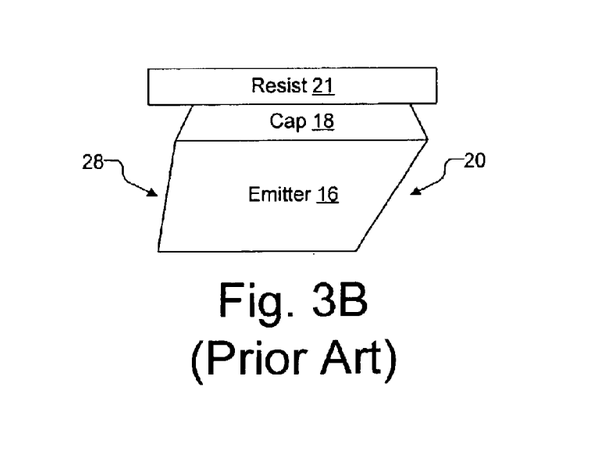

FIG. 3A illustrates a wet etching of the InP emitter 16 underneath photoresist 21 in a direction 45 degrees from the (100) wafer flat. This wet etch forms four ledges that can be used as reentry features 20. Unfortunately, experiments show that precise alignment (e.g., to less than one degree) of the wafer is necessary or inconsistent ledge shapes will form. In some cases, even ramps and other shapes may form instead of ledges. This is illustrated in FIG. 3B, where a misalignment of the wafer causes the wet etch to form a ramp 28 underneath photoresist 21 instead of a ledge.

Figure 4:
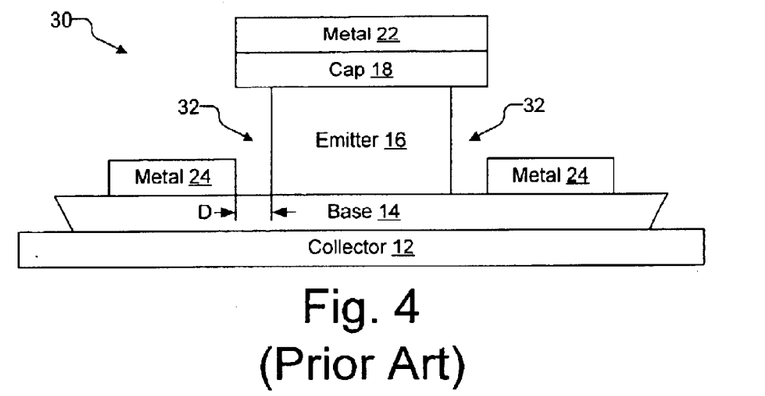

FIG. 4 illustrates an HBT 30 having reentry features 32 formed by a combination of dry and wet etch of emitter 16. A dry etch is first used to etch both cap 18 and emitter 16 to form vertical sidewalls down to base 14. Emitter 16 is next wet etched underneath cap 18 to create overhangs that form reentry features 32. Unfortunately, dry etch is not selective and thus requires precise control to avoid etching into base 14 and causing irreversible damage to HBT 30.

Thus, what is needed is a self-aligned process for fabricating emitter and base metal contacts while reducing base resistance in an HBT without precise alignment nor precise etch control.

SUMMARY

In one embodiment of the invention, a method for forming a heterojunction bipolar transistor (HBT) includes forming an etch mask atop an emitter cap layer of the HBT to expose a portion of the emitter cap layer, and selectively etching the exposed portion of the emitter cap layer to (1) form a reentry feature and (2) to expose a portion of the emitter layer.

The method further includes selectively etching the exposed portion of the emitter layer to expose a portion of the base layer, and forming a metal layer over the exposed portion of the base layer and the exposed portion of the emitter cap layer.

BRIEF DESCRIPTION OF THE DRAWINGS

The drawings provided are for illustrative purposes. The drawings are not to scale and do not represent the actual shape of the features unless otherwise specified.

DETAILED DESCRIPTION

In accordance with one aspect of the invention, an etch mask is used to selectively etch an emitter cap, instead of the emitter, in a heterojunction bipolar transistor to form reentry features for metal deposition. The reentry features allow metal contacts to self-align on the emitter cap and the base during metal deposition.

Figure 5:
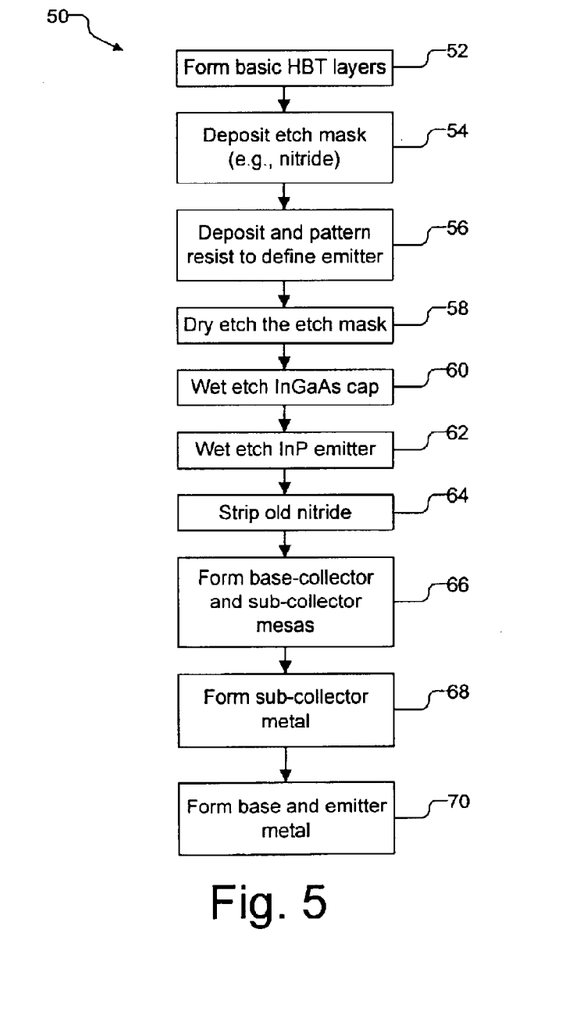
FIG. 5 is a flowchart of a method for a self-aligned process to form metal contacts in an HBT in accordance with one aspect of the invention.
Figure 6A:
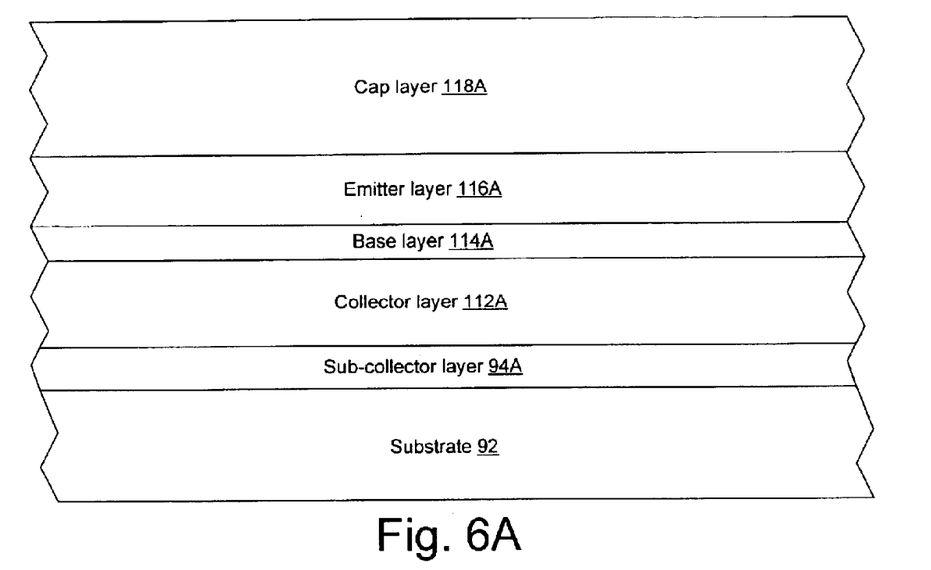
FIGS. 6A, 6B, 6C, 6D, 6E, and 6F are cross-sections of an HBT formed by the method of FIG. 5 in one embodiment of the invention.

FIG. 5 is a flowchart of a method 50 to form reentry features in one embodiment of the invention. In step 52, the basic HBT layers are formed as shown in FIG. 6A. The basic HBT layers include a substrate 92, a sub-collector layer 94A, a collector layer 112A, a base layer 114A, an emitter layer 116A, and an emitter cap layer 118A.

Substrate 92 and sub-collector layer 94A are typically InP (indium phosphide), collector layer 112A are typically InGaAs (indium gallium arsenide) or InP, base layer 114A is typically InGaAs or GaAsSb (gallium arsenide antimony), emitter layer 116A is typically InP or AlInAs (aluminum indium arsenide), and cap layer 118A is typically InGaAs.

These layers are appropriately doped to form an n-p-n or a p-n-p HBT. Additional, an AlInAs layer (not shown) can be inserted between the emitter and the base to improve device performance. In one embodiment, these layers are formed by OMVPE (organometallic vapor phase epitaxy).

Figure 6B:
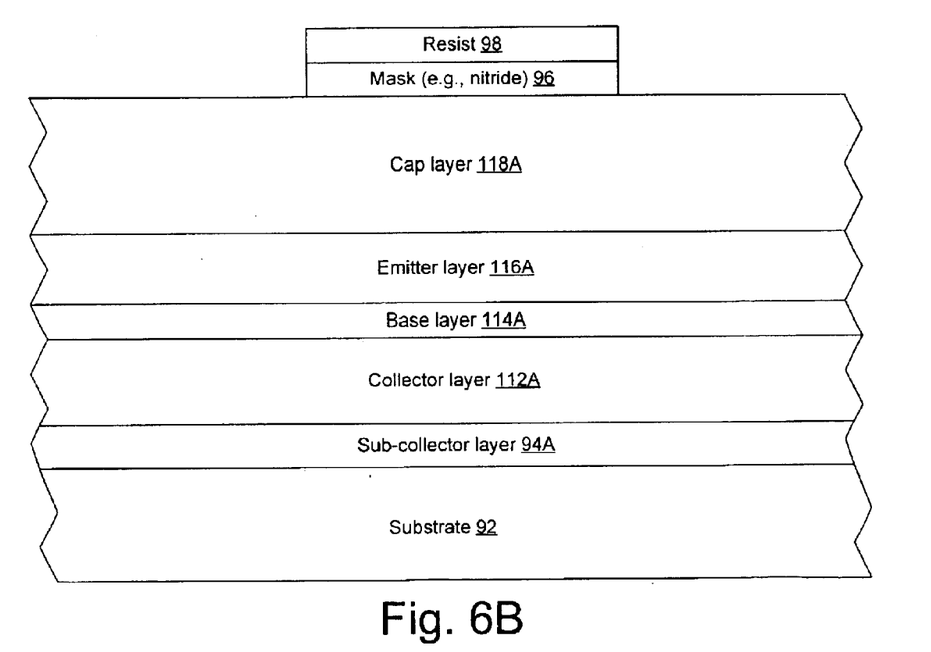

In steps 54 to 58, an etch masking layer 96 is formed and patterned as shown in FIG. 6B. Specifically, in step 54, etch masking layer 96 is formed atop cap layer 118A. The material of etch masking layer 96 is selected to produce a ledge or overhang in the InGaAs cap layer 118A when cap layer 118A is selectively etched underneath etch masking layer 96. Thus, a photoresist cannot be used as an etch mask for the InGaAs cap layer 118A as it would produce a sidewall that is a ramp instead of a ledge or overhang as shown in FIG. 2B. In one embodiment, etch masking layer 96 is made of nitride. Nitride can be formed by PECVD (plasma enhanced chemical vapor deposition). Alternatively, etch masking layer 96 is made of InP. InP can be grown by OMVPE.

In step 56, a photoresist layer 98 is deposited over the device area and patterned to expose a portion of etch masking layer 96. The unexposed portion of etch masking layer 96 defines emitter 116 (shown later in FIG. 6C).

In step 58, the exposed portion of etch masking layer 96 is removed by a nitride etch. In one embodiment, etch masking layer 96 is dry etched using reactive ion etching (RIE). Afterwards, photoresist 98 can be stripped from etch masking layer 96.

Figure 6C:
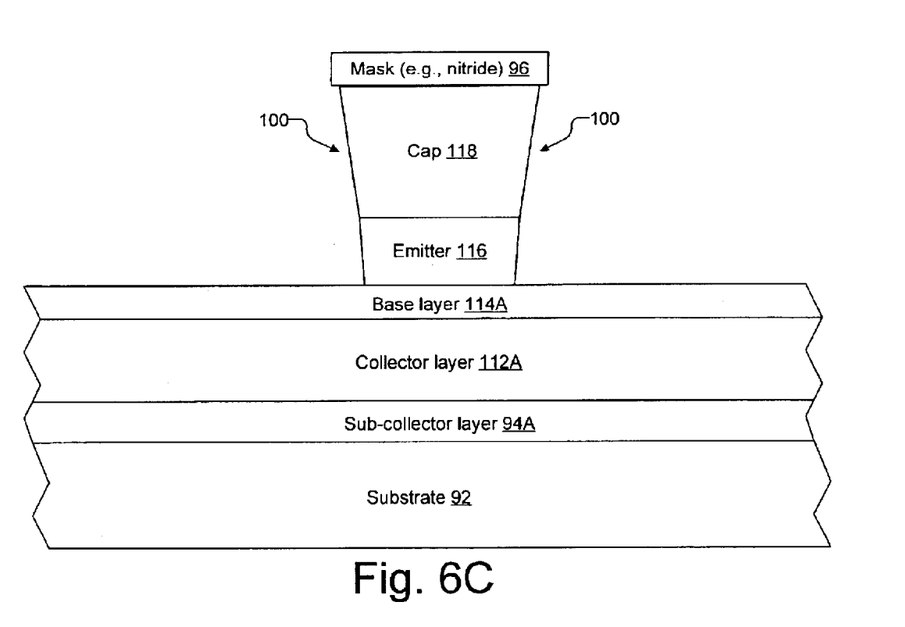

In step 60, emitter cap 118 is formed as shown in FIG. 6C. Cap 118 is formed by selectively etching cap layer 118A, thereby forming sidewalls with reentry features 100 and exposing emitter layer 116A. As described above, reentry features 100 are features with an undercut profile such as ledges and overhangs. In one embodiment, cap layer 118A is selectively etched by a wet etch using a solution of DI (de-ionized) water, H2SO4 (sulphuric acid), and hydrogen peroxide (e.g., at a 300:30:30 ratio). Experiments show that reentry features 100 can be consistently produced with a wet etch of the InGaAs cap layer 118A underneath a nitride or InP etch masking layer 96.

In step 62, emitter 116 is formed as shown in FIG. 6C. Emitter 116 is formed by selectively etching emitter layer 116A, thereby exposing base layer 114A. As emitter layer 116A is not used to create the reentry features, emitter layer 116A is selectively etched to produce a more vertical sidewall than cap layer 118A. In one embodiment, emitter layer 116A is selectively etched by a wet etch using a solution of HCl (hydrochloric acid) and H3PO4 (phosphoric acid) (e.g., at a 1:3 or 3:2 ratio).

In step 64, etch masking layer 96 is stripped.

Figure 6D:
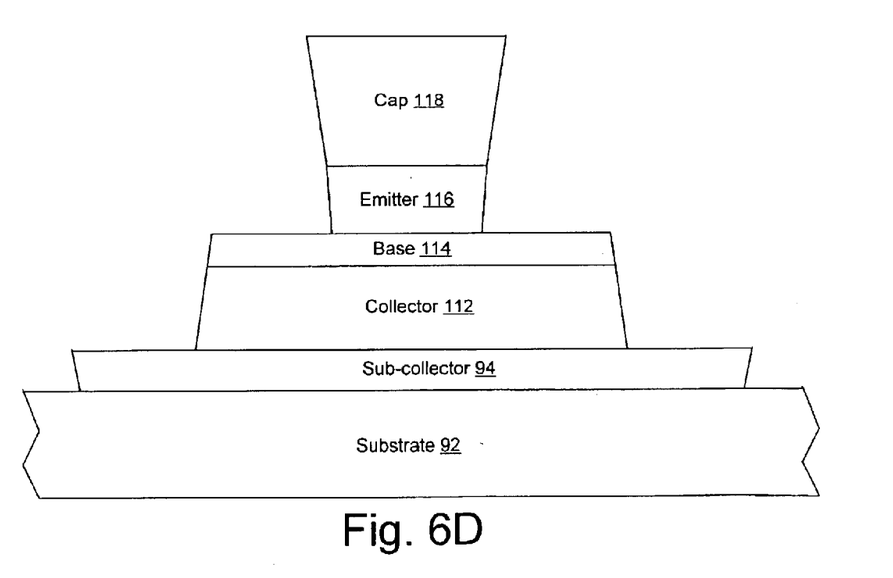

In step 66, base-collector mesa (including base 114 and collector 112) and sub-collector mesa (including sub-collector 94) are formed as shown in FIG. 6D. Base-collector mesa is first formed by depositing and patterning a nitride mask or a photoresist to expose and etch away portions of base layer 114A and collector layer 112A. Sub-collector mesa is then formed by depositing and patterning a photoresist to expose and etch away portions of sub-collector layer 94A. Conversely, the sub-collector mesa can be formed before the base-collector mesa in some embodiments.

Figure 6E:
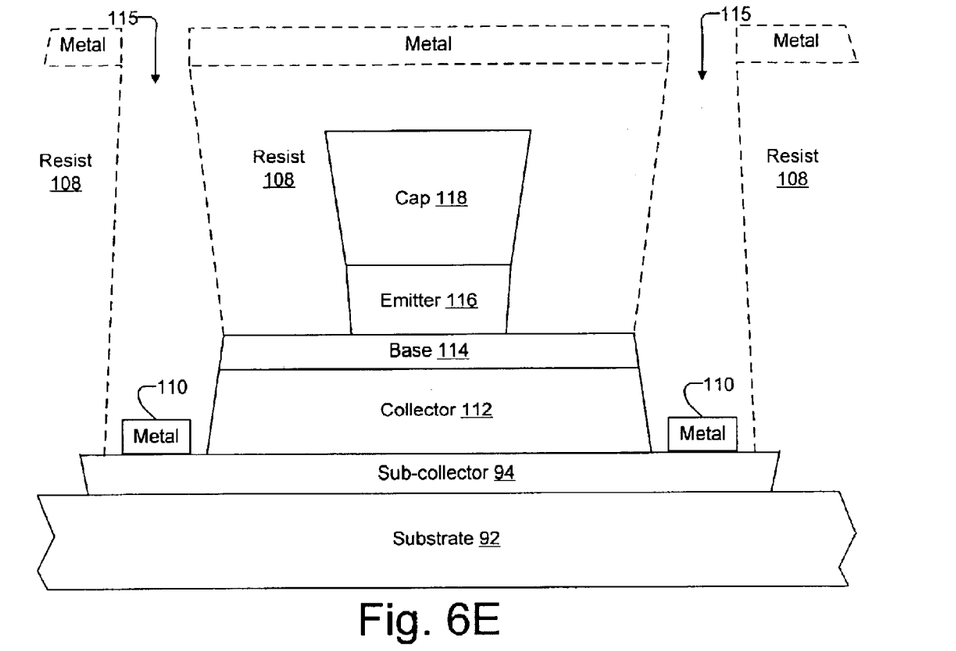

In step 68, sub-collector metal contacts 110 are formed as shown in FIG. 6E. In one embodiment, sub-collector metals 110 are formed by depositing and patterning a photoresist 108 to open windows 115 to sub-collector 94, and depositing metal atop photoresist 108 and through windows 115. Sub-collector metals 110 are typically Ti/Au or Ti/Pt/Au. Subsequently, photoresist layer 108 is stripped and the metal deposited thereon is lifted off.

Figure 6F:
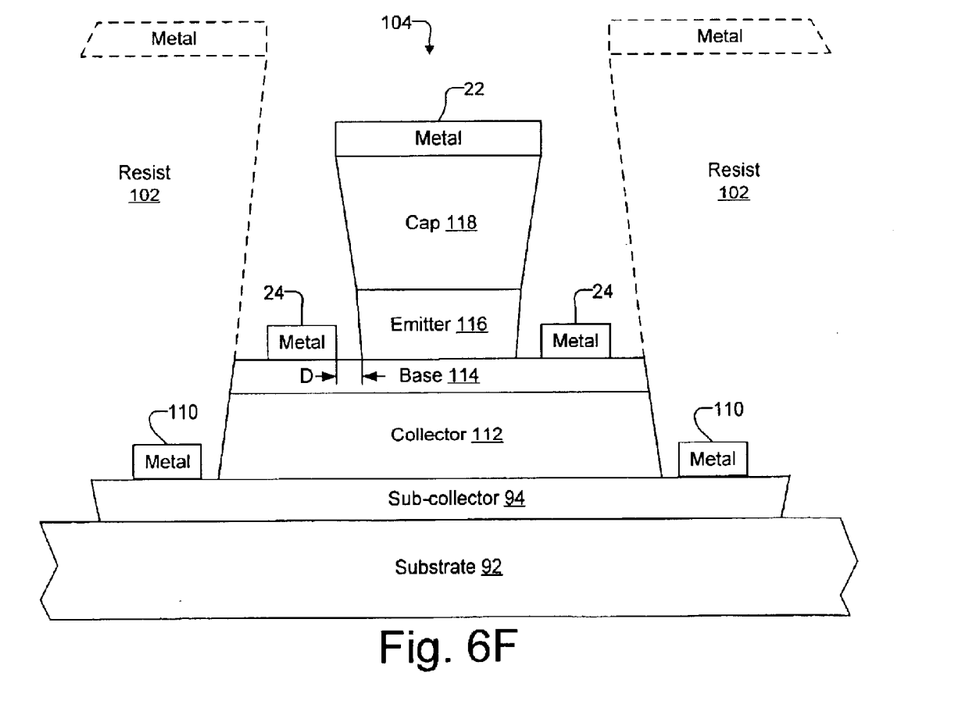

In step 70, a photoresist layer 102 is deposited over the device and patterned to open a window 104 to cap 118 and base layer 14A. Metal is deposited atop photoresist layer 102 and through window 104 to form emitter metal 22 and base metals 24. In one embodiment, metal is evaporated onto cap 118 and base 114 using electron beam or thermal evaporator. Emitter metal 22 and base metals 24 are typically Ti/Au (titanium gold) or Ti/Pt/Au (titanium platinum gold). Subsequently, photoresist layer 102 is stripped and the metal deposited thereon is lifted off.

In accordance with another aspect of the invention, another etch mask is used to selectively etch the base and the collector layers in the heterojunction bipolar transistor to form reentry features. The reentry features on the cap, base, and collector layers allow their respective metal contacts to be formed in a single metal deposition process.

Figure 7:
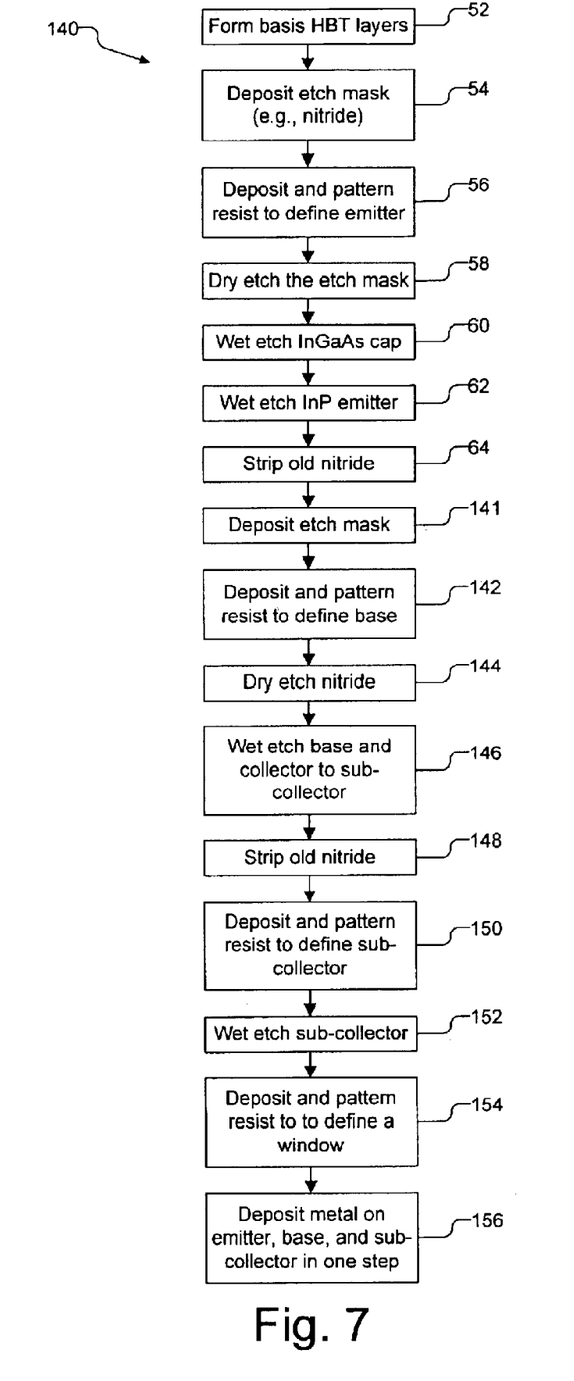
FIG. 7 is a flowchart of a method for a self-aligned process to form metal contacts in an HBT in accordance with another aspect of the invention.

FIG. 7 is a flowchart of a method 140 in one embodiment of the invention. Method 140 includes steps 52 to 64 of method 50 that form the structure shown in FIG. 6C. Step 64 is followed by a step 141.

Figure 8A:
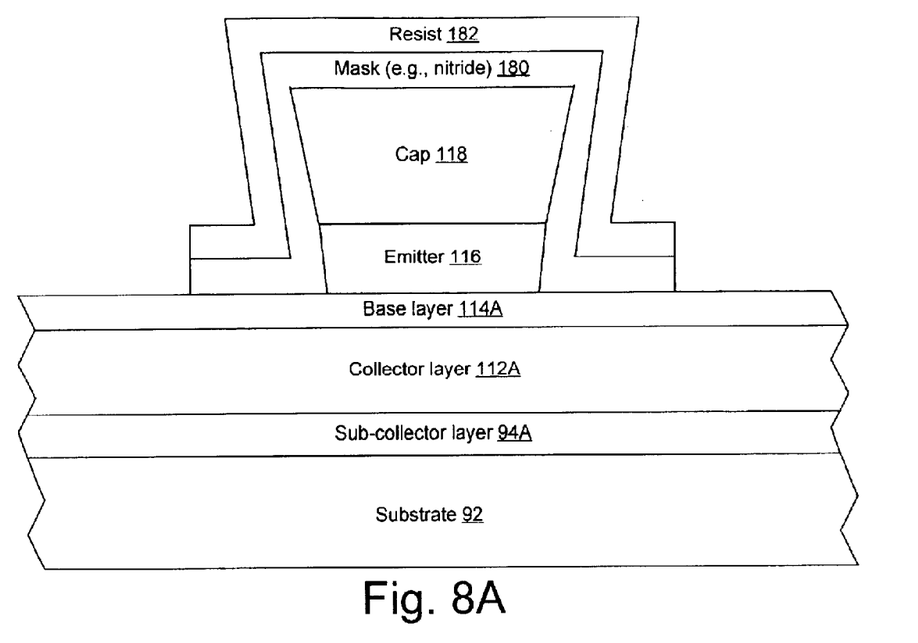
FIGS. 8A, 8B, 8C, and 8D are cross-sections of an HBT formed by the method of FIG. 7 in one embodiment of the invention.

In steps 141 to 144, a second etch masking layer 180 is formed and patterned using a photoresist 182 as shown in FIG. 8A. Specifically, in step 141, etch masking layer 180 is formed over the device. Etch masking layer 180 can be made of nitride. In one embodiment, etch masking layer 180 is formed by plasma enhanced chemical vapor deposition.

In step 142, photoresist layer 182 is deposited over the device and patterned to expose a portion of etch masking layer 180. The unexposed portion of etch masking layer 180 defines base 114 (FIG. 8B).

In step 144, the exposed portion of etch masking layer 180 is removed by a nonselective etch. In one embodiment, etch masking layer 180 is dry etched using reactive ion etching (RTE). After the dry etch, photoresist 182 can be stripped from etch masking layer 180.

Figure 8B:
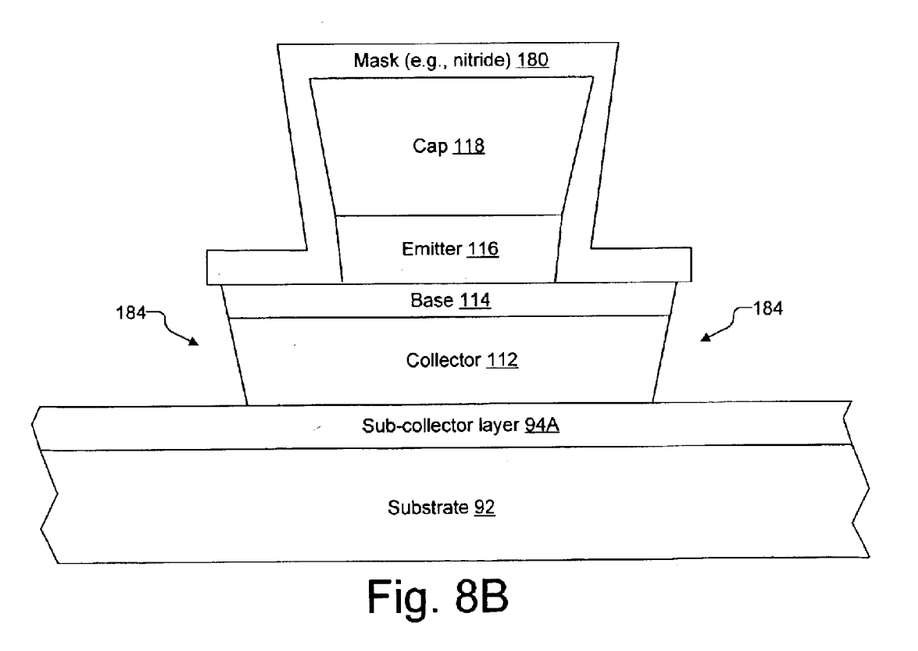

In step 146, base 114 and collector 112 are formed as shown in FIG. 8B. Base 114 and collector 112 are formed by selectively etching base layer 114A and collector layer 112A, thereby forming sidewalls with reentry features 184 and exposing sub-collector layer 94A. In one embodiment, base layer 114A and collector layer 112A are selectively etched by a wet etch. Wet etching base layer 114A and collector layer 112A also consistently produces reentry features due to the crystallographic nature of the wet etch with the nitride mask. This occurs in the same way as when cap 118 and emitter 116 were etched.

Figure 8C:
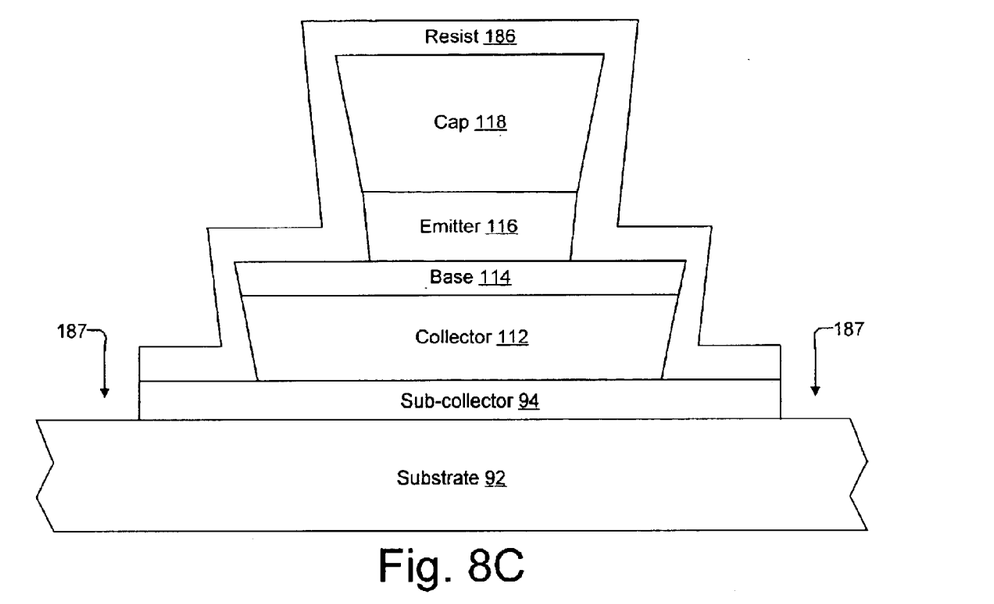

In steps 148 to 152, sub-collector 94 is formed as shown in FIG. 8C. Specifically, in a step 148, etch masking layer 180 is stripped.

In step 150, a photoresist 186 is deposited over the device and patterned to expose portions of sub-collector layer 94A.

In step 152, the exposed portions of sub-collector layer 94A are selectively etched to form trenches 187 to isolate the HBT from other devices. In one embodiment, sub-collector layer 94A is selectively etched by a wet etch.

Figure 8D:
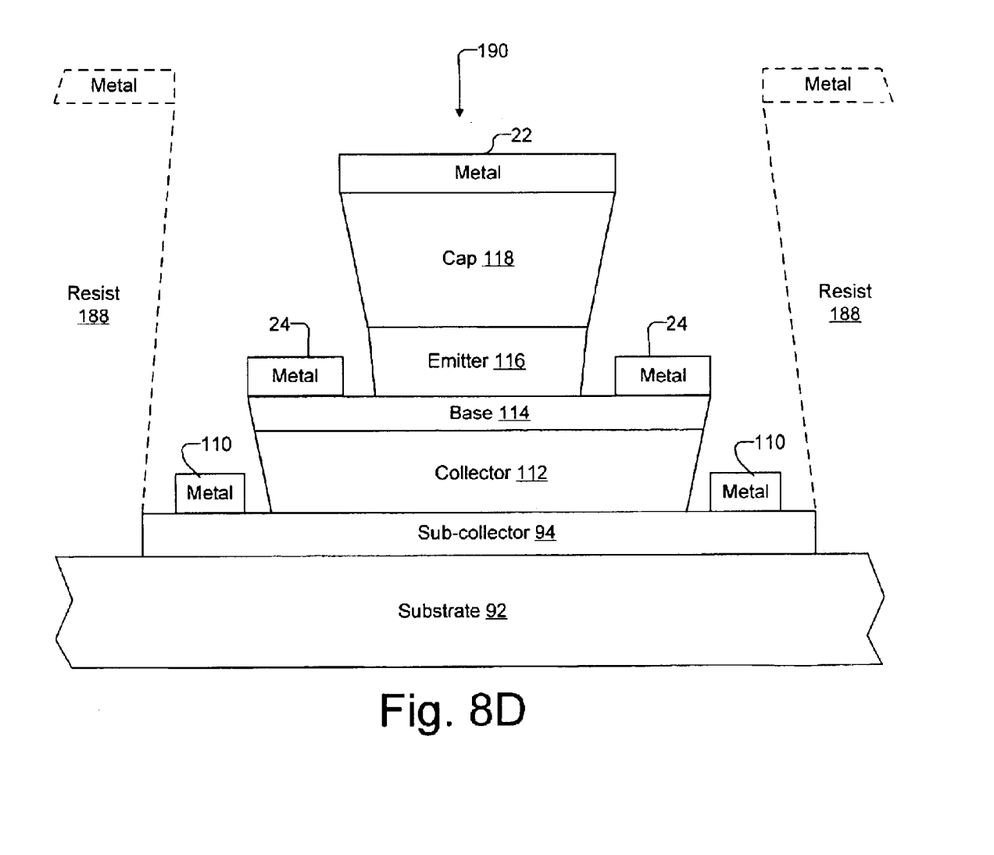

In steps 154 and 156, emitter metal 22, base metals 24, and sub-collector metals 110 are formed as shown in FIG. 8D. Specifically, in step 154, a photoresist 188 is deposited over the device and patterned to open a window 190 to sub-collector 94, base 114, and cap 118.

In step 156, metal is deposited atop photoresist 188 and through window 190 to form emitter metal 22, base metals 24, and sub-collector metals 110 in one step. In one embodiment, metal is deposited by electron beam or thermal evaporation. These metals are typically Ti/Au or Ti/Pt/Au. Subsequently, photoresist layer 108 is stripped and the metal deposited thereon is lifted off.

Various other adaptations and combinations of features of the embodiments disclosed are within the scope of the invention. In one embodiment, the above process can be modified to form a double HBT where the collector is made of InP instead of InGaAs. Specifically, the InGaAs base is selectively etched but the InP collector will be time etched (either dry or wet) until the InP sub-collector is reached and metal can be deposited thereon. In this embodiment, the base mesa includes only the base while the collector mesa includes the collector and the sub-collector. Numerous embodiments are encompassed by the following claims.

What is claimed is:

1. A method for forming a heterojunction bipolar transistor, comprising:

forming a sub-collector layer;

forming a collector layer atop the sub-collector layer;

forming a base layer atop the collector layer;

forming an emitter layer atop the collector layer;

forming a cap layer atop the emitter layer, wherein the base layer comprises a different material than at least one of the emitter layer and the collector layer;

forming an etch mask atop the cap layer to expose a portion of the cap layer;

selectively etching the exposed portion of the cap layer to form a sidewall with at reentry feature comprising an undercut profile and to expose a portion of the emitter layer;

selectively etching the exposed portion of the emitter layer to expose a portion of the base layer; and forming metal contacts on the exposed portion of the base layer and the exposed portion of the cap layer.

2. The method of claim 1, wherein said forming an etch mask comprises:

depositing an etch masking layer atop the cap layer;

forming and patterning a photoresist layer atop the etch masking layer to expose a portion of the etch masking layer; and etching the exposed portion of the etch masking layer to expose the portion of the cap layer.

3. The method of claim 1, wherein said selectively etching the exposed portion of the cap layer and said selectively etching the exposed portion of the emitter layer comprise wet etches.

4. The method of claim 1, wherein the etch mask is selected from the group consisting nitride and InP.

5. The method of claim 4, wherein the cap layer comprises InGaAs.

6. The method of claim 5, wherein the emitter layer is selected from the group consisting InP and AlInAs.

7. The method of claim 6, wherein the base layer is selected from the group consisting InGaAs and GaAsSb, the collector layer is selected from the group consisting InGaAs and InP, and the sub-collector layer comprises InP.

8. A method for forming a heterojunction bipolar transistor, comprising:

forming a sub-collector layer;

forming a collector layer atop the sub-collector layer;

forming a base layer atop the collector layer;

forming an emitter layer atop the collector layer;

forming a cap layer atop the emitter layer, wherein the base layer comprises a different material than at least one of the emitter layer and the collector layer;

forming an etch mask atop the cap layer to expose a portion of the emitter layer;

selectively etching the exposed portion of the cap layer to form a sidewall with a reentry feature and to expose a portion of the emitter layer;

selectively etching the exposed portion of the emitter layer to expose a portion of the base layer;

forming a second etch mask atop the exposed portion of the base layer to expose a second portion of the base layer;

selectively etching the second exposed portion of the base layer to form a second sidewall and to expose a portion of the collector layer; and forming metal contacts on the exposed portion of the base later and the exposed portion of the cap layer.

9. The method of claim 8, further comprising selectively etching the exposed portion of the collector layer to form a third sidewall and to expose a portion of the sub-collector layer, wherein at least one of the second sidewall and the third sidewalls forms a second reentry feature.

10. The method of claim 9, further comprising forming a metal contact on the exposed portion of the sub-collector layer, wherein said forming metal contacts on the exposed portion of the base layer and the exposed portion of the cap layer and said forming a metal contact on the exposed portion of the sub-collector layer comprises a single metal deposition.

11. The method of claim 10, wherein said selectively etching the exposed portion of the base layer and said selectively etching the exposed portion of the collector layer comprise wet etches.

12. The method of claim 8, wherein the second etch mask is selected from the group consisting nitride and InP.

* * * * *